(12) United States Patent
Chae et al.

(10) Patent No.: US 11,573,093 B2
(45) Date of Patent: Feb. 7, 2023

(54) METHOD FOR PREDICTING BATTERY CONSUMPTION OF ELECTRIC VEHICLE AND DEVICE FOR THE SAME

(71) Applicant: LG ELECTRONICS INC., Seoul (KR)

(72) Inventors: Jonghoon Chae, Seoul (KR); Wonho Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 393 days.

(21) Appl. No.: 16/835,846

(22) Filed: Mar. 31, 2020

(65) Prior Publication Data

US 2021/0180967 A1   Jun. 17, 2021

(30) Foreign Application Priority Data

Dec. 13, 2019  (KR) .......................... 10-2019-0166874

(51) Int. Cl.
| | |
|---|---|
| *G01C 21/34* | (2006.01) |
| *B60L 58/10* | (2019.01) |
| *G01R 31/367* | (2019.01) |
| *G01R 31/387* | (2019.01) |

(52) U.S. Cl.
CPC .......... *G01C 21/3469* (2013.01); *B60L 58/10* (2019.02); *G01C 21/3415* (2013.01); *G01R 31/367* (2019.01); *G01R 31/387* (2019.01)

(58) Field of Classification Search
CPC . G01C 21/3469; G01C 21/3415; B60L 58/10; B60L 2240/642; B60L 2260/54; B60L 58/12; B60L 3/0046; B60L 3/12; B60L 2240/64; B60L 2250/16; B60L 2250/18; G01R 31/367; G01R 31/387; Y02T 10/72; Y02T 10/70; Y02T 90/16; Y02T 10/7072; G06N 3/08; B60Y 2200/91
USPC .................................................. 701/423, 424
See application file for complete search history.

(56) References Cited

U.S. PATENT DOCUMENTS

| | | | | |
|---|---|---|---|---|
| 2013/0218366 | A1* | 8/2013 | Fukuda | G01C 21/3469 701/1 |
| 2014/0025255 | A1* | 1/2014 | Xiaoli | B60L 58/12 701/34.4 |
| 2014/0046595 | A1* | 2/2014 | Segawa | G01C 21/3676 701/400 |
| 2019/0272600 | A1* | 9/2019 | Lin | B60L 53/68 |

* cited by examiner

*Primary Examiner* — Paul Dinh

(74) *Attorney, Agent, or Firm* — Birch, Stewart, Kolasch & Birch, LLP

(57) ABSTRACT

The present disclosure relates to a method for predicting battery consumption of an electric vehicle and a device for the same. An electronic device includes an input unit which obtains destination information from a user, a memory, and at least one processor which is operatively connected to the input unit and the memory. The at least one processor may obtain a travel path of an electric vehicle, which is derived based on the destination information and may predict battery consumption when the electric vehicle travels along the travel path.

18 Claims, 7 Drawing Sheets

METHOD FOR PREDICTING BATTERY CONSUMPTION OF ELECTRIC VEHICLE AND DEVICE FOR THE SAME

CROSS REFERENCE TO RELATED APPLICATION

Pursuant to 35 U.S.C. § 119(a), this application claims the benefit of earlier filing date and right of priority to Korean Patent Application No. 10-2019-0166874, filed Dec. 13, 2019, the contents of which are all hereby incorporated by reference herein in its entirety.

BACKGROUND

The present disclosure relates to a method for predicting a battery consumption of an electric vehicle and a device for the same.

Recently, with the development of battery technology, eco-friendly policies and active encouragement policy of government, the spread of electric vehicles is increasing. However, due to insufficient lifespan of the battery and problems related to infrastructure such as a charging station, convenience and applicability for users who use the electric vehicle are not improved.

The electric vehicle provides information on a distance that the vehicle can travel in accordance with a current battery charge state. However, the information has a low accuracy, which causes the user to feel inconvenient.

In particular, the actual battery consumption may vary according to the environment of a road to be traveled by the electric vehicle, particularly, the altitude difference. However, there is not presented an example of predicting the battery consumption or of predicting a travel distance with reference to environmental conditions of the road. Therefore, provided information on the distance that the vehicle can travel according to the charge status may be just a reference.

SUMMARY

A battery consumption may vary according to various conditions such as road conditions, user's driving habits, etc. Particularly, the battery consumption may vary significantly according to the slope of the road even when the vehicle travels the same distance.

Therefore, various embodiments of the present invention may provide a method for more accurately predicting the battery consumption on the basis of the slope of the road or the altitude difference.

Various embodiments of the present invention may provide an electronic device which more accurately predicts the battery consumption on the basis of the slope of the road or the altitude difference and may provide an electric vehicle including such an electronic device.

The technical problem to be overcome in this document is not limited to the above-mentioned technical problems. Other technical problems not mentioned can be clearly understood from the those described below by a person having ordinary skill in the art.

According to various embodiments of the present disclosure, an electronic device includes an input unit which obtains destination information from a user, a memory, and at least one processor which is operatively connected to the input unit and the memory. The at least one processor may obtain a travel path of an electric vehicle derived based on the destination information and may predict a battery consumption when the electric vehicle travels along the travel path.

According to various embodiments of the present disclosure, an operating method of an electronic device may include obtaining a travel path of the electric vehicle derived based on destination information and predicting the battery consumption when the electric vehicle travels along the travel path.

According to various embodiments of the present disclosure, it is possible to show a result obtained by more accurately predicting a battery consumption according to the travel path of an electric vehicle.

According to various embodiments of the present disclosure, through the provision of more accurately predicted the battery consumption, a user is allowed to use the electric vehicle more stably.

Advantageous effects that can be obtained from the present disclosure is not limited to the above-mentioned effects. Further, other unmentioned effects can be clearly understood from the following descriptions by those skilled in the art to which the present disclosure belongs.

BRIEF DESCRIPTION OF THE DRAWINGS

Through the drawings, the same or similar components may be denoted by the same or similar reference numerals.

DETAILED DESCRIPTION OF THE DISCLOSURE

Figure 1:
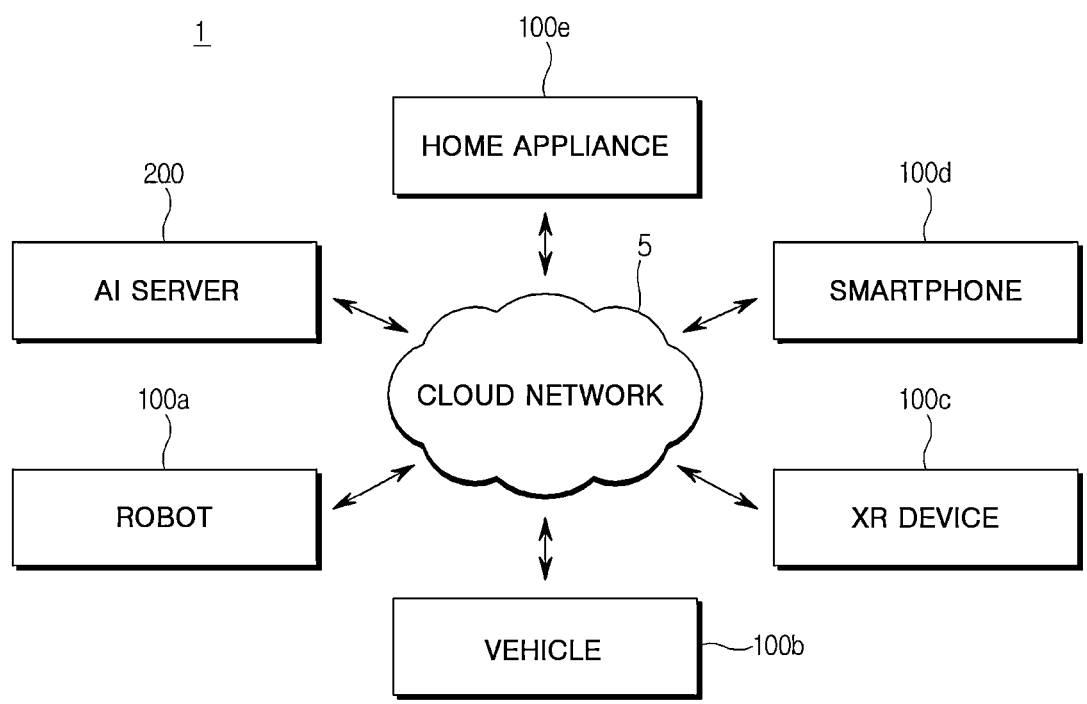
FIG. 1 is a diagram illustrating an AI system according to various embodiments.

Hereinafter, embodiments disclosed in this specification will be described in detail with reference to the accompanying drawings. The same or similar elements will be denoted by the same reference numerals irrespective of drawing numbers, and repetitive descriptions thereof will be omitted.

A suffix "module" or "part" for the component, which is used in the following description, is given or mixed in consideration of only convenience for ease of specification, and does not have any distinguishing meaning or function per se. Also, the "module" or "part" may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present invention may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the record medium may be resident within an application specific integrated circuit (ASIC). The ASIC may be resident within a user's terminal.

In the following description of the embodiment disclosed in the present specification, the detailed description of known technologies incorporated herein is omitted to avoid making the subject matter of the embodiment disclosed in the present specification unclear. Also, the accompanied drawings are provided only for more easily describing the embodiment disclosed in the present specification. The technical spirit disclosed in the present specification is not limited by the accompanying drawings. All modification, equivalents and substitutes included in the spirit and scope of the present invention are understood to be included in the accompanying drawings.

While terms including ordinal numbers such as the first and the second, etc., can be used to describe various components, the components are not limited by the terms mentioned above. The terms are used only for distinguishing between one component and other components.

In the case where a component is referred to as being "connected" or "accessed" to another component, it should be understood that not only the component is directly connected or accessed to the other component, but also there may exist another component between them. Meanwhile, in the case where a component is referred to as being "directly connected" or "directly accessed" to another component, it should be understood that there is no component therebetween.

FIG. 1 is a diagram illustrating an AI system according to various embodiments.

Referring to FIG. 1, in the AI system 1, one or more of an AI server 200, a robot 100a, a vehicle 100b, an XR device 100c, a smartphone 100d, or a home appliance 100e may be connected through a cloud network 5.

The cloud network 5 may mean a network which forms a part of a cloud computing infrastructure or exists within the cloud computing infrastructure. Here, the cloud network 5 may be configured with a 3G network, a 4G or long-term evolution (LTE) network, or a 5G network, etc.

According to various embodiments, the respective electronic devices 100a to 100e and 200 constituting the AI system 1 may be connected to each other through the cloud network 5. According to an embodiment, the respective electronic devices 100a to 100e and 200 can communicate with each other through base stations, and also, they can communicate directly with each other without base stations.

The AI server 200 may include a server which performs artificial intelligence processing and a server which performs operations on big data.

The AI server 200 may be connected through the cloud network 5 to at least one of the robot 100a, the vehicle 100b, the XR device 100c, the smartphone 100d, or the home appliance 100e which are electronic devices including artificial intelligence technologies that constitute the AI system 1. The AI server 200 may support at least a portion of the artificial intelligence processing of the connected electronic devices 100a to 100e.

According to various embodiments, the AI server 200 instead of the electronic devices 100a to 100e may train an artificial neural network in accordance with a machine learning algorithm and may directly store a learning model or transmit to the electronic devices 100a to 100e.

According to various embodiments, the AI server 200 may receive input data from the electronic devices 100a to 100e, may infer a result value for the received input data by using the learning model, and may generate a response or a control command based on the inferred result value to transmit it to the electronic devices 100a to 100e.

According to other various embodiments, the electronic devices 100a to 100e may infer the result value for the input data by directly using the learning model and may generate a response or a control command based on the inferred result value.

Artificial intelligence technologies are applied to the vehicle 100b where the method and device proposed in the present invention can be provided. The vehicle 100b may be implemented as a mobile robot, an electric vehicle, an unmanned air vehicle, etc.

The vehicle 100b may be an electric vehicle which is driven and powered by a battery in accordance with one embodiment or may be an autonomous vehicle in accordance with another embodiment. The autonomous vehicle may include an autonomous driving control module for controlling an autonomous driving function. The autonomous driving control module may mean a chip implemented with a software module or with the software module implemented in hardware. The autonomous driving control module may be included as a component of the vehicle 100b within the vehicle 100b or may be a separate hardware outside the vehicle 100b and connected to the vehicle 100b.

The vehicle 100b may obtain the state information of the vehicle 100b by using sensor information obtained from various kinds of sensors, detect (recognize) ambient environment and objects, generate map data, determine a travel path and a driving plan, or determine operations. Here, in order to determine the travel path and the driving plan, the vehicle 100b, as with the robot 100a, may use the sensor information obtained from at least one sensor among LIDAR, radar, and camera.

In particular, the vehicle 100b may also obtain a state of charge (SOC) of the battery of the electric vehicle by using a sensor, and the like, and recognize the state of the travel path by using a navigator, etc.

Also, the vehicle 100b may recognize environment or objects of an area where a view is blocked or an area spaced apart by a distance larger than a certain distance, by receiving the sensor information from s, or may receive the information directly recognized by external devices.

The vehicle 100b may perform the above operations by using a learning model composed of at least one artificial neural network. For example, the vehicle 100b may recognize ambient environment and objects by using the learning model and may determine a driving line by using information on the recognized ambient environment or the recognized object. Also, the vehicle 100b may predict a battery consumption on the basis of a travel distance and other conditions by using the learning model and may also predict a travelable distance on the basis of the current charge state of the battery. Here, the learning model may be trained directly by the vehicle 100b or may be trained by external devices such as the AI server 200, etc.

Here, the vehicle 100b may perform the operation by producing a result through the direct use of the learning model and may also perform the operation by transmitting the sensor information to external devices such as the AI server 200, etc., and by receiving the result produced accordingly.

The vehicle 100b may determine the travel path and driving plan by using at least one of the object information detected from the sensor information and the object information obtained from the external device, and may travel according to the determined travel path and driving plan by controlling a driving unit.

The map data may include object identification information on various objects disposed in a space (e.g., a road) where the vehicle 100b travels. For example, the map data may include the object identification information on fixed objects such as a street light, rock, buildings, etc., and movable objects such as vehicles, pedestrians, etc. Also, the object identification information may include names, types, distances, locations, etc.

Also, the vehicle 100b may perform the operation or travel by controlling the driving unit on the basis of the control/interaction of the user. Here, the vehicle 100b may obtain intent information of the interaction according to the action or voice utterance of the user and may determine a response based on the obtained intent information and perform the operation.

Figure 2:
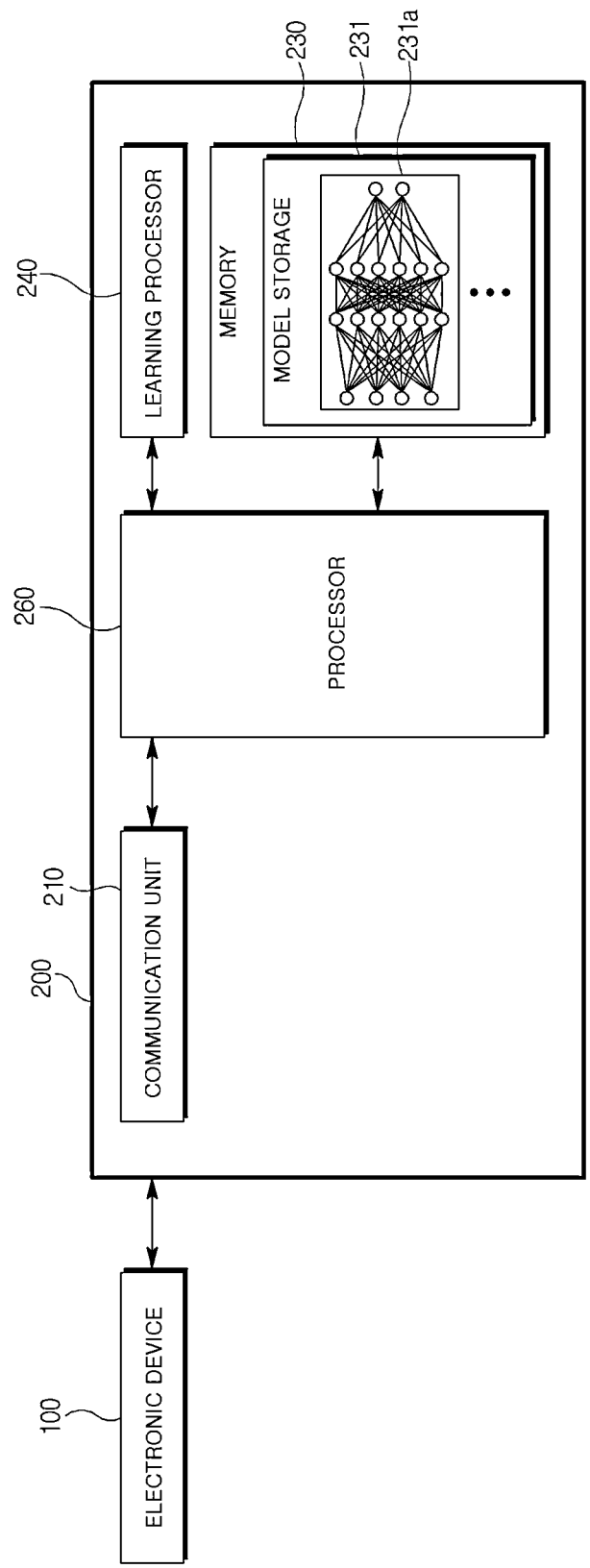
FIG. 2 is a diagram illustrating an AI server including artificial intelligence technologies according to various embodiments.

FIG. 2 is a diagram illustrating the AI server 200 including artificial intelligence technologies according to various embodiments.

Referring to FIG. 2, the AI server 200 may mean a device which trains the artificial neural network by using the machine learning algorithm or mean a device which uses the trained artificial neural network. Here, the AI server 200 may be composed of a plurality of servers to perform distributed processing or may be defined as a 5G network. According to the embodiment, the AI server 200 may be included as a component of the electronic device 100. Also, the AI server 200, together with the electronic device 100, may perform at least a portion of the artificial intelligence processing. According to the embodiment, when the electronic device 100 has insufficient computing power, the electronic device 100 may request the AI server 200 to perform a part of or all the artificial intelligence processing.

The AI server 200 may include a communication unit 210, a memory 230, a learning processor 240, and a processor 260.

The communication unit 210 may transmit and receive data to and from external devices such as the electronic device 100. According to the embodiment, the communication unit 210 may transmit and receive data to and from the external devices through the cloud network 5. According to another embodiment, the communication unit 210 may directly transmit and receive data to and from the external devices.

The memory 230 may include a model storage 231. The model storage 231 may store a model (or an artificial neural network 231a) which is being trained or has been trained through the learning processor 240.

The learning processor 240 may generate the learning model obtained by training the artificial neural network 231a through the use of learning data. The learning model may be used with being mounted on the AI server 200 of the artificial neural network or with being mounted on the external device such as the electronic device 100.

The learning model may be implemented in hardware, software, or by a combination of hardware and software. When the learning model is partially or wholly implemented in software, one or more instructions constituting the learning model may be stored in the memory 230.

The processor 260 may infer a result value for a new input data by using the learning model and may generate responses or control commands based on the inferred result value.

Figure 3:
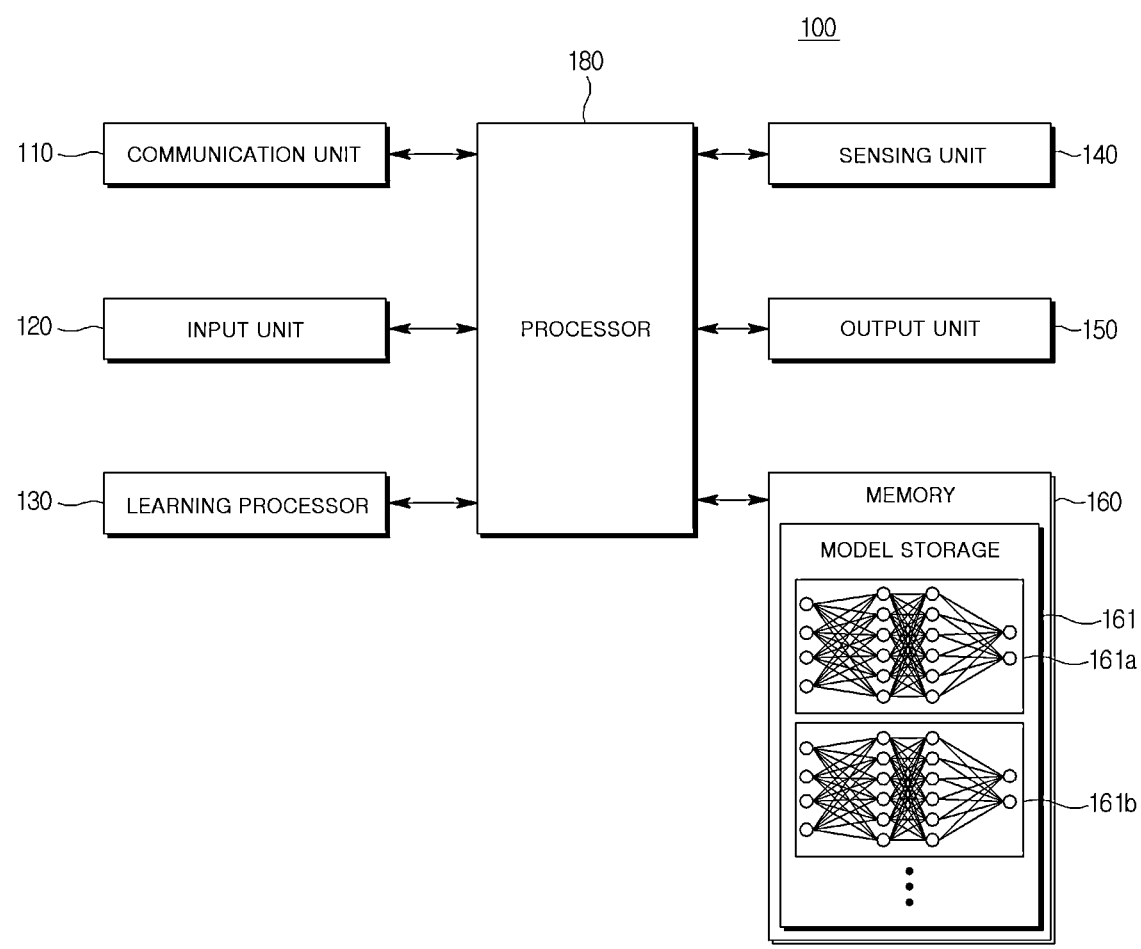
FIG. 3 is a diagram illustrating an electronic device which determines a battery consumption of a traveling vehicle on the basis of an ambient environment according to various embodiments.

FIG. 3 is a diagram illustrating the electronic device 100 which determines the battery consumption of a traveling vehicle on the basis of an ambient environment according to various embodiments.

The electronic device 100 may be a mobile device including a vehicle or an electric vehicle. Otherwise, the electronic device 100 may be one part, chip, module, electronic control unit (ECU) that is provided to the mobile device and performs assigned functions. The electronic device 100 including artificial intelligence technologies may be referred to as an AI device.

Referring to FIG. 3, the electronic device 100 may include a communication unit 110, an input unit 120, a learning processor 130, a sensing unit 140, an output unit 150, a memory 160, and a processor 180.

According to various embodiments, the communication unit 110 may transmit and receive data to and from external devices such as another electronic device or the AI server 200 by using wired and wireless communication technologies. For example, the communication unit 110 may transmit and receive the sensor information, a user input, the learning model, a control signal, etc., to and from external devices.

Here, the communication unit 110 may use wireless communication technologies including a Global System for Mobile communication (GSM), Code Division Multi Access (CDMA), Long Term Evolution (LTE), fifth generation communication (5G), Wireless LAN (WLAN), Wireless Fidelity (Wi-Fi), Dedicated Short Range Communication (DSRC), Bluetooth™, Radio Frequency Identification (RFID), Infrared Data Association (IrDA), ZigBee, and Near Field Communication (NFC) or wired communication technologies including Local Area Network (LAN), Wide Area Network (WAN), Metropolitan Area Network (MAN), and Ethernet.

According to various embodiments, the input unit 120 may obtain various types of data. The input unit 120 may include a camera for inputting an image signal, a microphone for receiving an audio signal, and a user input unit for receiving information from a user. Here, the camera or the microphone may be treated as a kind of sensor, and the signal obtained from the camera or microphone may be referred to as sensing data or sensor information. Therefore, the camera or microphone may be included in the sensing unit 140.

The input unit 120 may obtain learning data for model learning and obtain input data, etc., to be used when obtaining an output by using the learning model. The input unit 120 may obtain raw input data, and, in this case, the processor 180 or the learning processor 130 may extract input features as preprocessing for the input data.

According to various embodiments, the learning processor 130 may be configured to receive, classify, store, and output information to be used for data mining, data analysis, intelligent decision making, and machine learning algorithms and technologies.

The learning processor 130 may include one or more memory units configured to store data received, detected, sensed, generated, predefined, or in another way output by the electronic device 100 or data received, detected, detected, generated, predefined, or in another way output by another component, device, electronic device or a device communicating with the electronic device.

The learning processor 130 may include a memory integrated with or implemented in the electronic device 100. In some embodiments, the learning processor 130 may be implemented by using the memory 160.

Optionally or additionally, the learning processor 130 may be implemented by using a memory related to the electronic device 100, for example, an external memory coupled directly to the electronic device 100 or a memory maintained in a server communicating with the electronic device 100.

In another embodiment, the learning processor 130 may be implemented by using a memory maintained in a cloud computing environment or by using another remote memory location accessible by the electronic device 100 through a communication method such as a network.

The learning processor 130 may be generally configured such that data is stored in one or more databases in order that the data is identified, indexed, categorized, manipulated, stored, retrieved and output for the purpose that data is used in supervised learning, unsupervised learning, reinforcement learning, data mining, predictive analytics or in other electronic devices.

Through use of any of a variety of different types of data analysis algorithms and machine learning algorithms, the information stored by the learning processor 130 may be used by one or more other controllers of the electronic device 100 or the processor 180.

Examples of such algorithms include k-nearest neighbor system, fuzzy logic (e.g., probability theory), neural network, Boltzmann machine, vector quantization, pulse neural network, support vector machine, maximum margin classifier, hill climbing, inductive logic system Bayesian network, Petri Net (e.g., finite state machine, Mealy machine, Moore finite state machine), classifier tree (e.g., perceptron tree, support vector tree, Markov tree, decision tree forest, random forest), stake model and system, artificial fusion, sensor fusion, image fusion, reinforcement learning, augmented reality, pattern recognition, automated planning, and the like.

The learning processor 130 may store an artificial neural network (ANN) model used in the machine learning algorithm in the memory 160, generate the learning model obtained by training the artificial neural network model and store the learning model in the memory 160. In addition, the learning processor 140 may perform tasks such as classification, detection, and recognition based on data input by using the learning model.

Artificial intelligence refers to the field of studying artificial intelligence or methodology for making artificial intelligence, and the machine learning refers to the field of defining various issues dealt with in the field of artificial intelligence and studying methodology for solving the various issues. The machine learning is defined as an algorithm that enhances the performance of a certain task through steady experience with the certain task.

The artificial neural network is a model used in machine learning and may mean a whole model which has a problem-solving ability and is composed of artificial neurons (nodes) that form a network by synaptic connections. The artificial neural network may be defined by a connection pattern between neurons of different layers, a learning process for updating model parameters, and an activation function for generating an output value.

Figure 4:
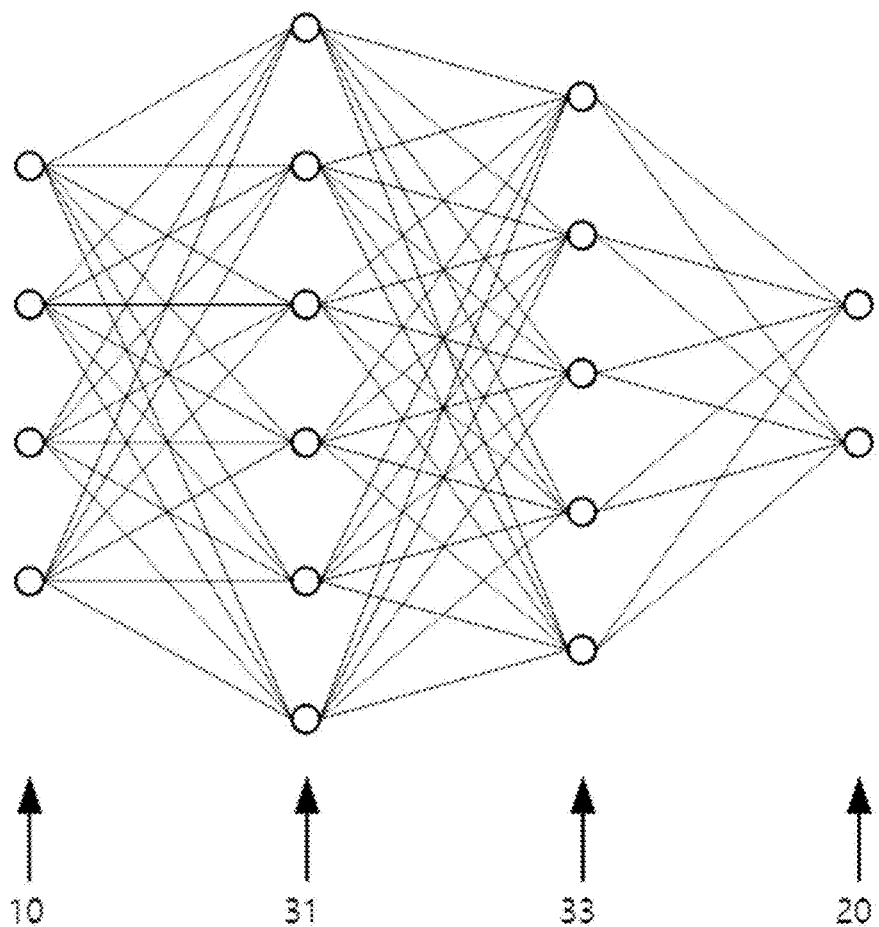
FIG. 4 is a diagram illustrating an example of a fully connected artificial neural network structure.

FIG. 4 is a diagram illustrating an example of a fully connected artificial neural network structure.

Referring to FIG. 4, the artificial neural network may include au input layer 10, an output layer 20, and optionally one or more hidden layers 31 and 32. Each layer includes one or more neurons which correspond to the neurons in the neural network, and the artificial neural network may include a synapse that links a node in one layer with a node in another layer. In the artificial neural network, a node may receive input signals input through the synapse, and generate an output value based on an activity function of a weight and a bias for each input signal. The output value of each node may act as an input signal to the next layer through the synapse. An artificial neural network in which all the nodes of one layer and all the nodes of the next layer are connected through the synapses may be referred to as a fully connected artificial neural network.

Parameters of the artificial neural network model may mean parameters determined by learning, and may include the weight of the synaptic connections and bias of neurons, etc. In addition, a hyper parameter may mean a parameter to be set before learning in the machine learning algorithm, and may include a learning rate, the number of times of the repetition, a mini batch size, an initialization function, and the like.

Machine learning, which is implemented by a deep neural network (DNN) including a plurality of hidden layers among artificial neural networks, is called deep learning, and the deep learning is part of the machine learning. Hereinafter, the machine learning may be used as meaning the deep running.

Figure 5:
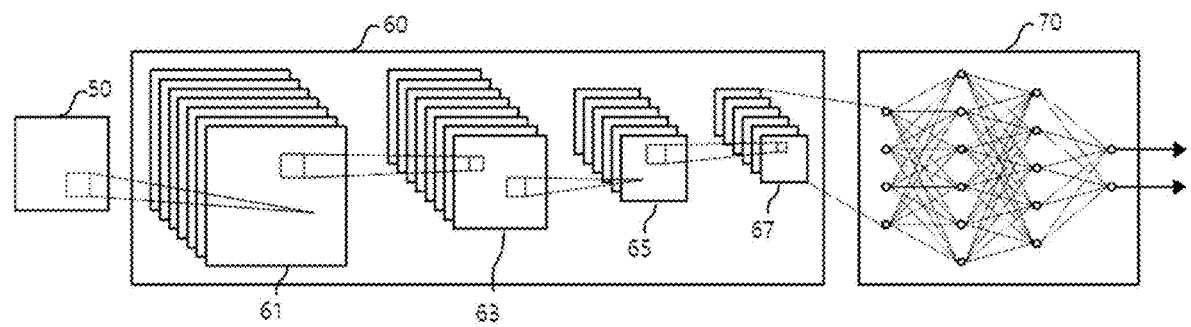
FIG. 5 is a diagram illustrating an example of a structure of a convolutional neural network (CNN), that is, a kind of a deep neural network.

FIG. 5 is a diagram illustrating an example of a structure of a convolutional neural network (CNN), that is, a kind of the deep neural network.

In the identification of structural spatial data such as images, moving pictures, and character strings, a convolutional neural network structure as shown in FIG. 3 may be more effective. The convolutional neural network can effectively recognize features associated with adjacent images while maintaining spatial information of the image.

Referring to FIG. 5, the convolutional neural network may include a feature extraction layer 60 and a classification layer 70. The feature extraction layer 60 may synthesize those located spatially close in the image by using convolution and then extract the features of the image.

The feature extraction layer 60 may be configured by stacking a plurality of convolution layers 61 and 65 and a plurality of pooling layers 63 and 67. By the convolution layers 61 and 65, the activation function may be applied after a filter is applied to input data. The convolution layers 61 and 65 may include a plurality of channels. By each of the channels, different filters and/or different activation functions may be applied. The result of the convolution layers 61 and 65 may be a feature map. The feature map may be data in the form of a two-dimensional matrix. The pooling layers 63 and 67 may receive output data of the convolution layers 61 and 65, that is, the feature map, as an input, and may be used to reduce the size of the output data or to emphasize specific data. The pooling layers 63 and 67 may generate output data by applying a max pooling function which selects the maximum value among some data of the output data of the convolution layers 61 and 65, an average pooling function which selects an average value, and a min pooling function which selects the minimum value.

The feature map which is generated through a series of the convolution layers and the pooling layers may become gradually smaller in size. A final feature map generated through the last convolution layer and the last pooling layer may be converted to have a one-dimensional form and be input to the classification layer 70. The classification layer 70 may have the fully connected artificial neural network structure shown in FIG. 2. The number of input nodes in the classification layer 70 may be equal to a number obtained by multiplying the number of elements of a matrix of the final feature map by the number of channels.

In addition to the above-described convolutional neural network, a recurrent neural network (RNN), a long short-term memory (LSTM) network, and gated recurrent units (GRU) may be also used as the deep neural network structure. The recurrent neural network can classify or predict by learning sequential data. The recurrent neural network has a recurrent structure therein, so that the learning of the past time is multiplied by a weight and is reflected in the current learning. Thus, the current output result is affected by the output result from the past time, and the hidden layer performs a kind of memory function. The recurrent neural network may be used to analyze a voice waveform and to perform a machine translation, may be used to identify front and back components of a text sentence, and to generate a text, or may be used to recognize voices.

The purpose of artificial neural network learning is regarded as determining a model parameter that minimizes a loss function. The loss function may be used as an index for determining an optimal model parameter in the learning process of the artificial neural network. In the case of a fully connected artificial neural network, the weight of each synapse may be determined by learning. In the case of the convolutional neural network, a filter of the convolution layer for extracting the feature map may be determined by learning.

The machine learning may be classified into supervised learning, unsupervised learning, and reinforcement learning on the basis of a learning method.

The supervised learning refers to a method of training the artificial neural network in a state in which a label for learning data is given. The label may mean a correct answer (or a result value) that the artificial neural network must infer when the learning data is input to the artificial neural network. The unsupervised learning may refer to a method of training the artificial neural network in a state in which a label for learning data is given. The reinforcement learning may refer to a learning method of training an agent defined in a certain environment to select a behavior or a behavior sequence that maximizes the cumulative reward in each state.

The learning processor 130 may train models 161*a* and 161*b* composed of artificial neural networks by using the learning data. According to the embodiment, the learning processor 130 may train the models 161*a* and 161*b* composed of a plurality of artificial neural networks. In this case, the learning data for each model may vary depending on the purpose of each model. Here, the trained artificial neural network may be referred to as a learning model. The learning model may be implemented in hardware, software, or by a combination of hardware and software. The learning model may be used to infer a result value for a new input data instead of the learning data and may be used as a basis for determination to perform a certain operation. According to the embodiment, the learning processor 130 may perform the artificial intelligence processing together with the learning processor 240 of the AI server 200.

The learning processor 130 may be integrated with the processor 180 of the electronic device 100. In addition, the learning model which is executed in the learning processor 130 may be implemented in hardware, software, or by a combination of hardware and software. When the learning model is partially or wholly implemented in software, one or more instructions constituting the learning model may be stored in the memory 160, an external memory coupled directly to the electronic device 100 or a memory which is maintained in an external device. The learning processor 130 may realize an AI processing program by reading the instruction from the memory and executing the instruction.

According to various embodiments, the sensing unit 140 may obtain at least one of information on the inside of the electronic device 100, information on ambient environment of the electronic device 100, and user information by using various sensors. For example, the sensing unit 140 may obtain a state of charge of the electric vehicle battery.

Here, the sensing unit 140 may include a proximity sensor, an illuminance sensor, an acceleration sensor, a magnetic sensor, a gyro sensor, an inertial sensor, an RGB sensor, an IR sensor, a fingerprint sensor, an ultrasonic sensor, an optical sensor, a microphone, a camera, LIDAR, radar, a pressure sensor, a force sensor, and the like.

According to various embodiments, the output unit 150 may generate an output related to a visual sense, an auditory sense, or a tactile sense, etc. The output unit 150 may include a display for outputting visual information, a speaker for outputting auditory information, a haptic module for outputting tactile information, and the like.

According to various embodiments, the memory 160 may store data supporting various functions of the electronic device 100. For example, the memory 160 may include input data obtained by the input unit 120, learning data, a learning model, a learning history, instructions for the learning processor 130, instructions for the processor 180, and a model (or an artificial neural network), etc., which is being trained or has been trained through the learning processor 130.

According to various embodiments, the processor 180 may determine at least one executable operation of the electronic device 100 on the basis of information that is determined or generated by using a data analysis algorithm or a machine learning algorithm. In addition, the processor 180 may control the components of the electronic device 100 and perform the determined operation. A program used by the processor 180 performing the operation may be stored in the memory 160.

The processor 180 may request, search, receive or utilize the data of the learning processor 130 or the memory 160 and may control the components of the electronic device 100 such that operations which are predicted or are determined to be desirable among the at least one executable operation are performed.

When the processor 180 needs to be associated with an external device in order to perform the determined operation, the processor 180 may generate a control signal for controlling the corresponding external device and transmit the generated control signal to the corresponding external device.

The processor 180 may obtain information on the intent of the user input and determine user's requirements based on the obtained intent information.

The processor 180 may collect history information including operation contents of the electronic device 100 or a user's feedback on the operation, and the like, and store the history information in the memory 160 or in the learning processor 130, or transmit the history information to the external device such as the AI server 200, etc. The collected history information may be used to update the learning model.

The processor 180 may control at least some of the components of the electronic device 100 in order to execute an application program stored in the memory 160. In addition, the processor 180 may operate two or more of the components included in the electronic device 100 in combination with each other in order to execute the application program.

Figure 6:
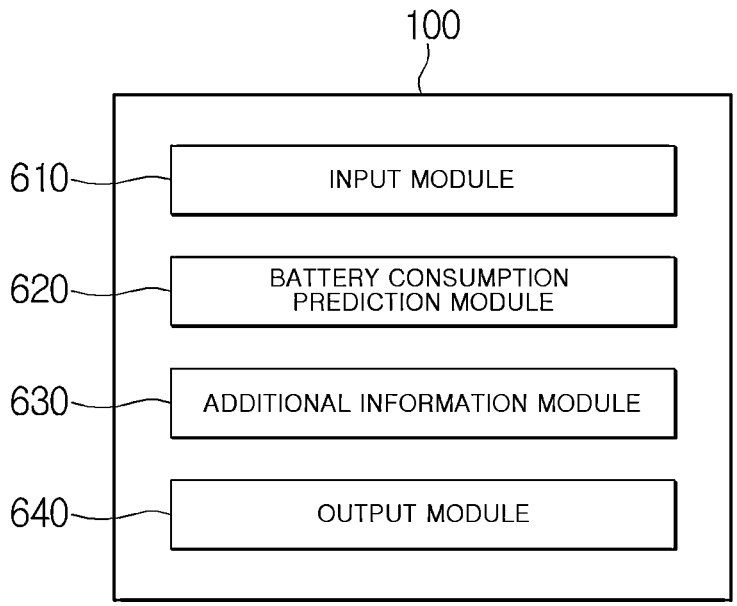
FIG. 6 is a block diagram illustrating functions for allowing a processor and/or a learning processor of the electronic device to perform a method which is proposed in the present disclosure and predicts the battery consumption of an electric vehicle, in accordance with various embodiments.

FIG. 6 is a block diagram illustrating functions for allowing the processor 180 and/or the learning processor 130 of the electronic device 100 to perform a method which is proposed in the present disclosure and predicts the battery consumption of the electric vehicle, in accordance with various embodiments. The block diagram of FIG. 6 shows an example of briefly illustrating software components required for the electronic device 100 to predict the battery consumption. According to the embodiment, some components may be omitted. According to another embodiment, other unshown components may be further added. In addition, several components may be integrated with each other, or one component may be divided into a plurality of components. Each component shown in FIG. 6 may be implemented by a separate program, or some components may be closely related to each other and implemented by a single program.

Referring to FIG. 6, the processor 180 and/or the learning processor 130 of the electronic device 100 may perform the functions of an input module 610, a battery consumption prediction module 620, an additional information module 630, and an output module 640.

According to various embodiments, the input module 610 may obtain destination information from the user. Also, the input module 610 may obtain current location information of the electric vehicle from a GPS module or a navigator provided in the electric vehicle. Based on this, the input module 610 may obtain a travel path to be traveled by the electric vehicle. According to the embodiment, the input module 610 may directly receive travel path information from the navigator. The navigator may receive the destination information from the user, propose a plurality of travel paths to the user on the basis of the current location, and provide the travel path information selected by the user to the input module 610.

According to various embodiments, the battery consumption prediction module 620 may predict the battery consumption until reaching the destination on the basis of the travel path obtained by the input module 610.

According to the embodiment, the battery consumption prediction module 620 may predict driving record-based battery consumption.

When there is a previous driving record for the travel path obtained by referring to an existing driving record, the battery consumption prediction module 620 obtains a result of the battery consumption of the corresponding driving. Based on this, the battery consumption of the current driving can be predicted. According to the embodiment, when there is a plurality of driving records for a travel path, the battery consumption may be predicted by means of statistical techniques (e. g., average, mode, and median).

According to another embodiment, the battery consumption prediction module 620 may predict section-based battery consumption.

The battery consumption prediction module 620 may divide the travel path into sections of a certain predetermined distance, predict the battery consumption of each section in consideration of the battery consumption based on an altitude difference between a start point and an end point of each section, and predict the battery consumption for entire path by summing the battery consumptions of each section. For example, the battery consumption prediction module 620 may divide the travel path into 100 in distance sections, and predict the battery consumption based on a difference between the altitude of the start point and the altitude of the end point of each section.

The battery consumption prediction module 620 may use a list method or an artificial neural network model so as to predict the battery consumption by the altitude difference.

According to the embodiment, the battery consumption prediction module 620 may use a list method of predicting the battery consumption by using a list as shown in the following Table 1.

TABLE 1

| Altitude Difference | Battery Consumption (%) |
| --- | --- |
| −5 m | 0.001 |
| −4 m | 0.002 |
| . . . | |
| 0 m | 0.005 |
| . . . | |
| 4 m | 0.01 |
| 5 m | 0.03 |

In Table 1, the unit of the battery consumption can be expressed as a percentage of the charge amount of a fully charged battery. For example, 0.01% may represent the charge amount of a fully charged battery/10,000.

According to the embodiment, the battery consumption prediction module 620 may obtain the altitude difference between the start point and the end point of the section of a predetermined distance (for example, 100 m) while the electric vehicle is traveling, and may collect a result value obtained by actually measuring the battery consumption in the corresponding section. Here, the altitude values of the start point and the end point of the section may be obtained by using a digital elevation model (DEM). An example of the DEM is Google Maps API (https://developers.google.com/maps/documentation/elevation/start). The battery consumption prediction module 620 may transmit the collected data to an electric vehicle manufacturer, and the electric vehicle manufacturer may predict the battery consumption according to the altitude difference by applying statistical techniques to the collected data and may generate the list of Table 1. The electric vehicle manufacturer may store the generated list of Table 1 in the memory and release the electric vehicle. Therefore, the battery consumption prediction module 620 may predict the battery consumption by using the list of Table 1 generated based on collected information on the same type of the electric vehicle during the initial operation. In addition, the battery consumption prediction module 620 may update the list of Table 1 by adapting the list of Table 1 to the user who drives the electric vehicle. According to the embodiment, the battery consumption prediction module 620 may obtain the altitude difference between the start point and the end point of the section of a predetermined distance when the user is driving and may obtain a result value obtained by actually measuring the battery consumption in the corresponding section. Table 1 may be replaced based on a result obtained by collecting the obtained information for a certain period of time and by processing it statistically, or the list of Table 1 may be updated by combining the information with the contents of Table 1. When such an update is performed, the list of Table 1 may be specialized for the user.

According to another embodiment, the battery consumption prediction module 620 may predict the battery consumption on the basis of the trained artificial neural network model. The trained artificial neural network model is based on the example of the artificial neural network model shown in FIG. 4 or FIG. 5. The trained artificial neural network model may be an artificial neural network model to which the supervised learning has been applied by using the battery consumption according to the altitude difference collected by the battery consumption prediction module 620 as learning data. The trained artificial neural network model may use the altitude information as an input and provide battery consumption information as an output. The battery consumption prediction module 620 may obtain the altitude difference between the start point and the end point of the section of a predetermined distance (for example, 100 m) while the electric vehicle is traveling, and may collect a result value obtained by actually measuring the battery consumption in the corresponding section. The battery consumption prediction module 620 may transmit the information to an electric vehicle manufacturer or use it internally. The electric vehicle manufacturer may generate the trained artificial neural network model by training the artificial neural network on the basis of the information obtained from all the same type of the electric vehicles. The electric vehicle manufacturer may release the electric vehicle including the trained artificial neural network model, and the battery consumption prediction module 620 of a first purchased electric vehicle may predict the battery consumption by using in the beginning the trained artificial neural network model generated by the electric vehicle manufacturer. However, the battery consumption prediction module 620 may additionally train the artificial neural network model by using information on the battery consumption according to each altitude difference obtained by itself, and may update and use the artificial neural network model trained to be adapted to the electric vehicle driver. According to the embodiment, when it is determined that the electronic device 100 has an insufficient computing power, the battery consumption prediction module 620 may perform the above-described learning by using the external AI server 200, and may receive the trained artificial neural network module from the AI server 200 and use it.

According to another embodiment, the battery consumption prediction module 620 may predict the battery consumption for the entire path by combining the driving record-based battery consumption prediction and the section-based battery consumption prediction. For example, while there may already exist a driving record for a part of the travel path obtained by the input module 610, there may not exist a driving record for the rest of the travel path. Here, the battery consumption prediction module 620 may predict the battery consumption by using the battery consumption information included in the driving record for a part of the travel path having the driving record, and by using the list or the section-based battery consumption prediction using the artificial neural network for the travel path having no driving record. The battery consumption prediction module 620 may predict the battery consumption for a total travel path on the basis of the information obtained from both sides mentioned above.

According to the embodiment, in order to enable such a combination, when the driving record is stored, it may be divided and stored according to specific conditions. For example, if the vehicle starts from a point A and travels to a point E via intersections B, C, and D, the driving record may be stored in such a manner as to be divided into sections of from the point A to the intersection B, from the intersection B to the intersection C, from the intersection C to the intersection D, and from the intersection D to the point E.

According to various embodiments, the additional information module 630 may determine whether the electric vehicle can reach the destination by comparing the battery consumption predicted by the battery consumption prediction module 620 with the current battery charge state of the electric vehicle. Alternatively, when the additional information module 630 determines that the electric vehicle cannot reach the destination in view of the current battery charge state, it determines that charging is required. In this case, the additional information module 630 may additionally obtain information on nearby charging stations, obtain information on charging stations that the vehicle can reach in view of the current battery charge state, and set the charging station as a stopover point, and may generate new path information including the stopover point. In addition, when the input module 610 obtains a plurality of pieces of path information, the additional information module 630 may determine path information having the minimum battery consumption by comparing the predicted battery consumptions for the plurality of pieces of path information.

According to various embodiments, the output module 640 may output an alarm to the user on the basis of the determination result of the additional information module 630. According to the embodiment, when the electric vehicle needs to be charged before reaching the destination, the output module 640 may output new path information including a charging station set as a stopover point by the additional information module 630 to the user. According to another embodiment, the output module 640 may output, to the user, a path having the minimum battery consumption as a result of the determination of the additional information module 630 as to the plurality of pieces of path information.

As described above, the processor 180 or the learning processor 130 of the electronic device 100 may more accurately predict the battery consumption according to the altitude difference for each section, thereby increasing convenience and applicability for the user.

According to various embodiments, an electronic device (e.g., the electronic device 100 of FIG. 3) may include an input unit (e.g., the input unit 120 of FIG. 3) that obtains destination information from the user, a memory (e.g., the memory 160 of FIG. 3), and at least one processor (e.g., the processor 180 and the learning processor 130 of FIG. 3) which is operatively connected to the input unit and the memory.

According to various embodiments, the at least one processor may obtain a travel path of the electric vehicle derived based on the destination information and may predict battery consumption when the electric vehicle travels along the travel path.

According to various embodiments, the at least one processor determines whether there exists a driving record for the travel path. When there exists a driving record for the travel path, the at least one processor may predict the battery consumption on the basis of the driving record when the vehicle travels along the travel path. When there does not exist a driving record for the travel path, the at least one processor may divide the travel path into a plurality of sections, predict the battery consumption based on the altitude difference for each section, and predict the battery consumption when the vehicle travels along the travel path.

According to various embodiments, when there does not exist a driving record for the travel path, the at least one processor may divide the travel path into sections of the same predetermined distance, obtain the altitude difference by obtaining the altitude of the start point and the altitude of the end point of each section, predict the battery consumption for each section on the basis of the altitude difference, and predicting the battery consumption when the electric vehicle travels along the travel path, by summing the predicted battery consumptions for each section.

According to various embodiments, the at least one processor may store, in the memory, a list generated such that the altitude difference and the battery consumption are in correspondence with each other, and may predict the battery consumption for each section by obtaining the battery consumption corresponding to the altitude difference obtained for each section from the list stored in the memory.

According to various embodiments, the list is obtained by obtaining the battery consumption and the altitude difference measured in the section of a predetermined distance and by performing statistical processing when there exists a plurality of battery consumptions obtained for the same altitude difference. The at least one processor may obtain the battery consumption and the altitude difference measured in the section of a predetermined distance while operating the electric vehicle, and may update the list by using a result of performing statistical processing when there exists a plurality of battery consumptions obtained for the same altitude difference.

According to various embodiments, the memory may include a trained artificial intelligence network model configured to receive the altitude difference as an input and to output the battery consumption. The at least one processor may predict the battery consumption for each section on the basis of the battery consumption which is output by inputting the altitude difference obtained for each section to the trained artificial intelligence network model.

According to various embodiments, the trained artificial intelligence network model is obtained through supervised learning in which the battery consumption and the altitude difference measured in the section of a predetermined distance while operating the electric vehicle are provided as learning data. The at least one processor may measure the battery consumption and the altitude difference in the section of a predetermined distance while operating the electric vehicle equipped with the electronic device, and may update the trained artificial intelligence network model by performing the supervised learning on the trained artificial intelligence network model by using the measured altitude difference and battery consumption as learning data. According to the embodiment, the training of the artificial intelligence network model may be performed by the external AI server 200.

According to various embodiments, the at least one processor may determine whether there exists only a driving record for a part of the travel path. When there exists only a driving record for a part of the travel path, the at least one processor may predict the battery consumption on the basis of the driving record, for a part of the travel path having the driving record. For the rest of the travel path having no driving record, the at least one processor may divide the rest of the travel path into a plurality of sections, predict the battery consumption based on the altitude difference for each section, and then predict the battery consumption for the rest of the travel path. The at least one processor may stun the predicted battery consumption for a part of the travel path and the predicted battery consumption for the rest of the travel path and then may predict the battery consumption when the electric vehicle travels along the travel path.

According to various embodiments, the electronic device may further include a sensing unit (e.g., the sensing unit 140 of FIG. 3) that senses a battery charge state of the electric vehicle. The at least one processor may determine whether the electric vehicle is able to reach the destination by comparing the battery consumption predicted when the electric vehicle travels along the travel path with the battery charge state of the electric vehicle. When, as a result of the determination, the electric vehicle is determined to be unable to reach the destination, the at least one processor may select, on the basis of the battery charge state, a charging station that the vehicle can reach, set the charging station as a stopover point, generate a new travel path including the stopover point, and inform the user of it.

According to various embodiments, the at least one processor may obtain a plurality of travel paths derived based on the destination information, predict the battery consumption when the electric vehicle travels along each of the plurality of travel paths, and recommend one of the plurality of travel paths to the user on the basis of the predicted battery consumption.

Figure 7:
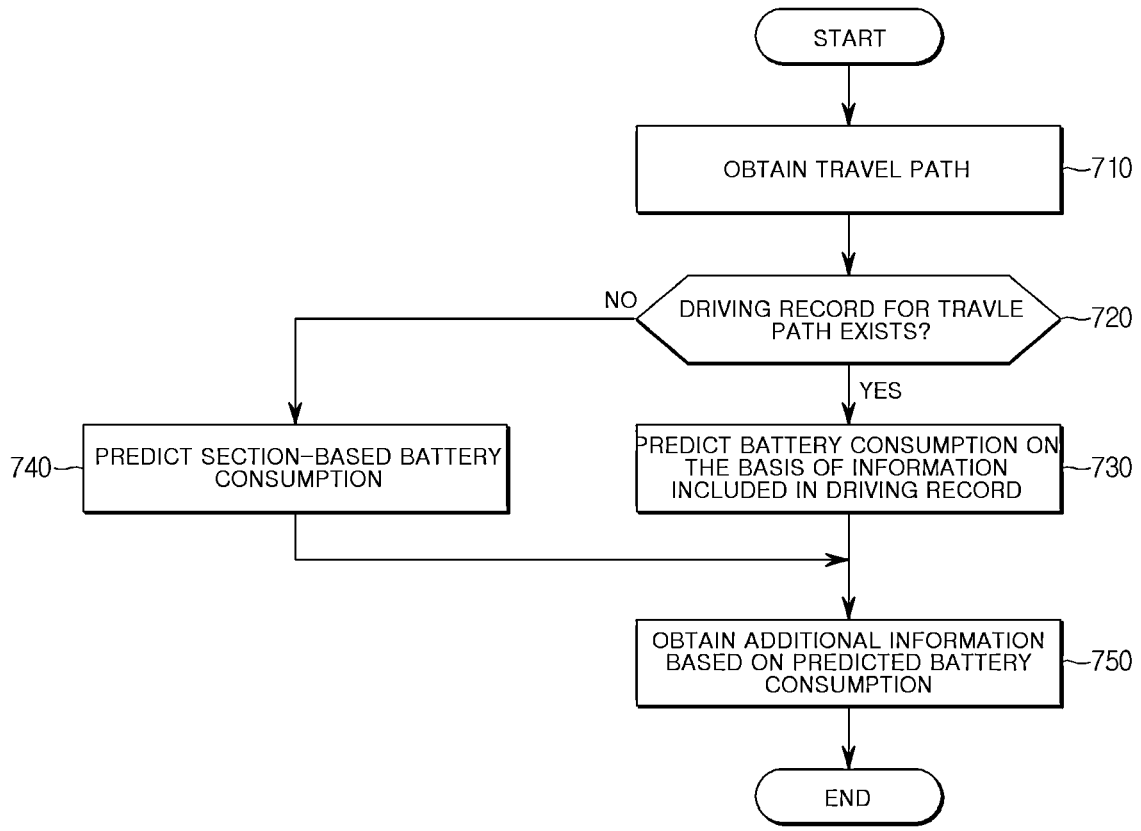
FIG. 7 is a flowchart illustrating operations in which the electronic device predicts the battery consumption in accordance with various embodiments when the vehicle travels to a destination.

FIG. 7 is a flowchart illustrating operations in which the electronic device predicts the battery consumption in accordance with various embodiments when the vehicle travels to a destination. The operations according to the flowchart shown in FIG. 7 can be performed by an electronic device (e.g., the electronic device 100 of FIG. 3) or at least one processor (e.g., the processor 180 or the learning processor 130 of FIG. 3) of the electronic device.

Referring to FIG. 7, in operation 710, the electronic device 100 may obtain a travel path to a destination. The electronic device 100 may receive a destination from the user and obtain the travel path derived by a navigator. According to the embodiment, the navigator may provide a plurality of travel paths.

According to various embodiments, in operation 720, the electronic device 100 may determine whether there exists a driving record for the obtained travel path.

When there exists a driving record, the electronic device 100 may predict the battery consumption on the basis of the driving record in operation 730. According to the embodiment, when there exists a previous driving record for the travel path obtained in operation 710, a battery consumption result of the corresponding driving may be obtained and the battery consumption of the current driving may be predicted on the basis of the battery consumption result. In addition, when there is a plurality of driving records for a corresponding travel path, the battery consumption may be predicted by means of statistical techniques.

When there does not exist a driving record, the electronic device 100 may predict the section-based battery consumption in operation 740. The section-based battery consumption prediction method will be described in more detail later with reference to FIG. 9.

In operation 750, the electronic device 100 may additionally obtain additional information on the basis of the section-based battery consumption prediction in operation 740 or the driving record-based battery consumption prediction result in operation 730. According to the embodiment, the electronic device 100 may determine whether the electric vehicle can reach the destination by comparing the battery consumption predicted in operation 730 or 740 with the current battery charge state of the electric vehicle. When, as a result of the determination, the electric vehicle is determined to be unable to reach the destination, the electronic device 100 additionally obtain information on nearby charging stations, obtain information on charging stations that the vehicle can reach in view of the current battery charge state, and set the charging station as a stopover point, and may generate new path information including the stopover point. The electronic device 100 may suggest information that charging is required and newly generated path information to the user. According to another embodiment, when the electronic device 100 obtains a plurality of pieces of path information, the electronic device 100 may determine a path having the minimum battery consumption by comparing the predicted battery consumptions for the plurality of pieces of path information and may inform the user of it.

Figure 8:
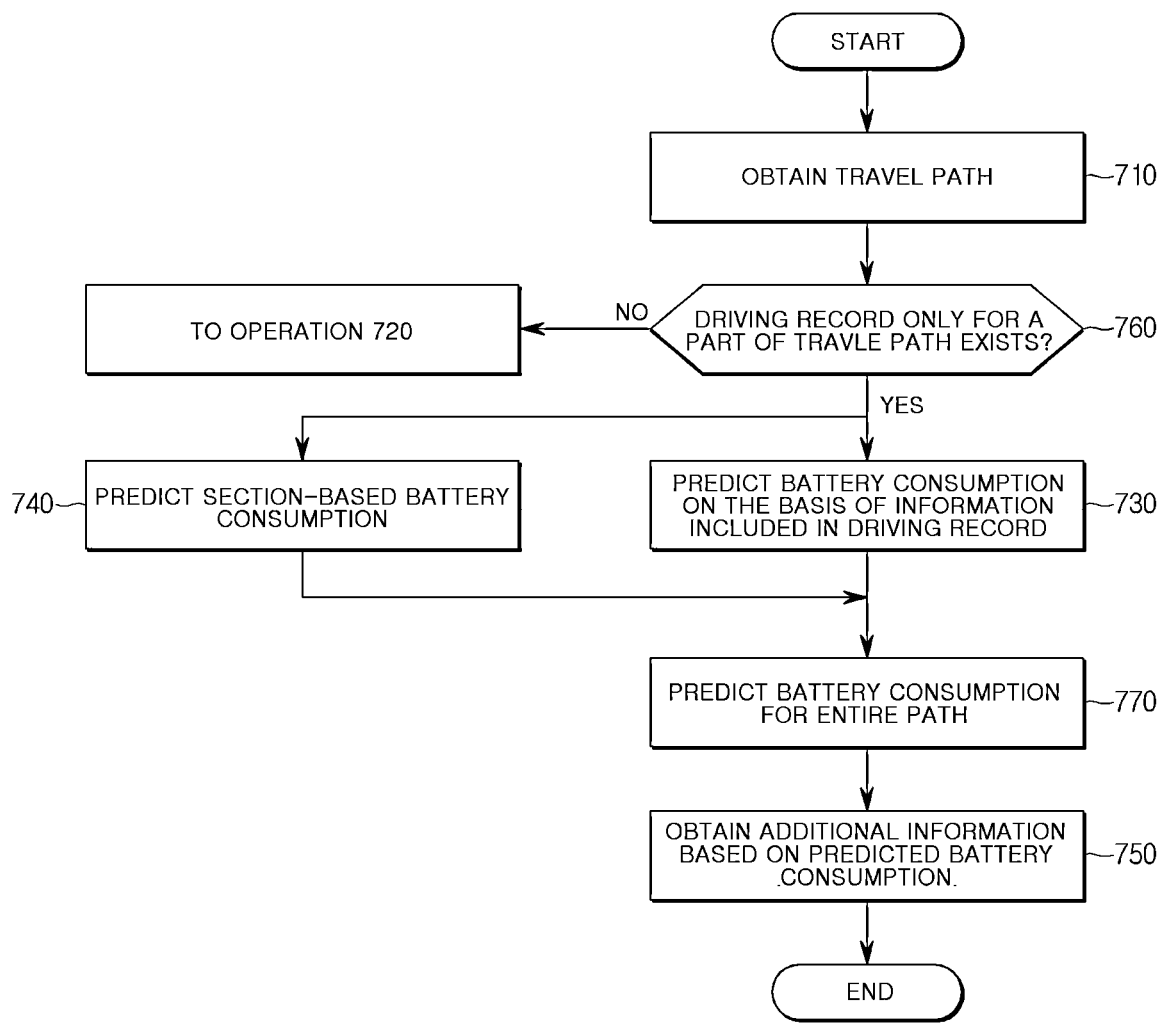
FIG. 8 is a flowchart illustrating operations in which the electronic device predicts the battery consumption when there exists a driving record only for a part of a travel path.

FIG. 8 is a flowchart illustrating operations in which the electronic device 100 predicts the battery consumption when there exists a driving record only for a part of a travel path. The operations according to the flowchart shown in FIG. 8 can be performed by an electronic device (e.g., the electronic device 100 of FIG. 3) or at least one processor (e.g., the processor 180 or the learning processor 130 of FIG. 3) of the electronic device.

Referring to FIG. 8, in operation 710, the electronic device 100 may obtain a travel path, and, in operation 760, the electronic device 100 may determine whether there exists a driving record only for a part of the obtained travel path. When, as a result of the determination, there does not exist a driving record only for a part of the travel path, that is, when there exists a driving record for the entire travel path or when there does not exist a driving record for the entire travel path, the electronic device 100 may perform operation 720. According to the embodiment, the electronic device 100 may perform operation 720 first and perform operation 760 when there does not exist a driving record for the entire travel path, and may perform the section-based battery consumption prediction of operation 740 when there does not exist a driving record for even a part of the travel path.

When there exists a driving record only for a part of the travel path as a result of the determination in operation 760, the electronic device 100 may predict the battery consumption for a part of the travel path having the driving record on the basis of the information included in the driving record in operation 730. Also, the electronic device 100 may predict the battery consumption for the rest of the travel path having no driving record through the section-based battery consumption prediction in operation 740.

Then, in operation 770, the electronic device 100 may predict the battery consumption for the entire path by summing the battery consumption for a part of the travel path predicted in operation 730 and the battery consumption for the rest of the travel path predicted in operation 740.

In operation 750, the electronic device 100 may obtain additional information on the basis of the battery consumption predicted in operation 770. Operation 750 of FIG. 8 and operation 750 of FIG. 7 may be the same step.

Figure 9:
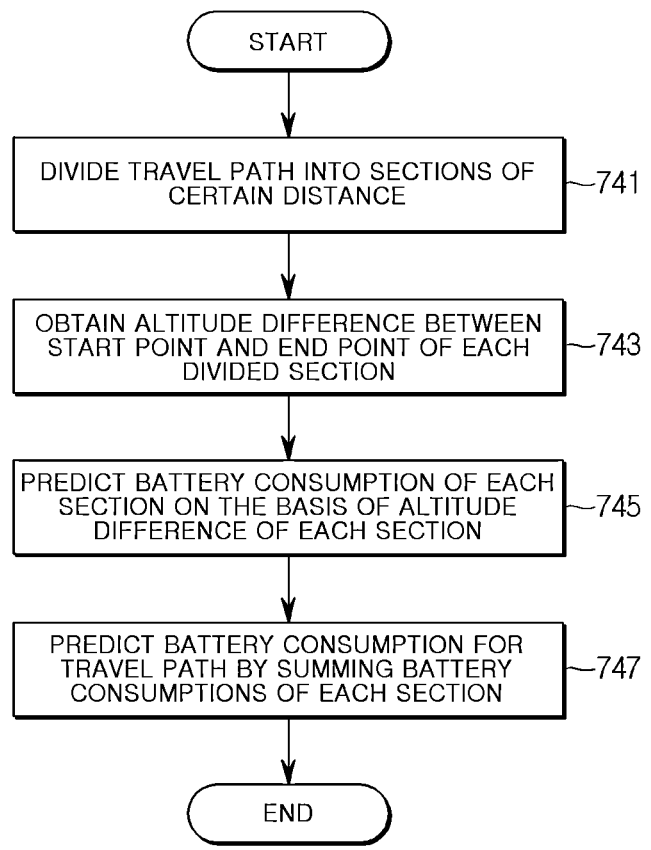
FIG. 9 is a flowchart illustrating operations in which the electronic device predicts the section-based battery consumption.

FIG. 9 is a flowchart illustrating operations in which the electronic device 100 predicts the section-based battery consumption. The operations according to the flowchart shown in FIG. 9 can be performed by an electronic device (e.g., the electronic device 100 of FIG. 3) or at least one processor (e.g., the processor 180 or the learning processor 130 of FIG. 3) of the electronic device.

Referring to FIG. 9, in operation 741, the electronic device 100 may divide a travel path into sections of a certain distance (e.g., 100 m) in order to predict the section-based battery consumption. Accordingly, each section can have the same distance.

In operation 743, the electronic device 100 may obtain the altitude difference by calculating the altitude of the start point and the altitude of the end point of each divided section. For example, the electronic device 100 may use the DEM to obtain the altitude of the start point and the altitude of the end point of the section and obtain the difference between the altitudes.

In operation 745, the electronic device 100 may predict the battery consumption of each section on the basis of the altitude difference of each section. According to the embodiment, the electronic device 100 may predict the battery consumption on the basis of the list shown in Table 1 mentioned above or predict the battery consumption on the basis of the trained artificial neural network. The list shown in Table 1 can be obtained by obtaining, on the basis of a past driving record, the altitude of the section and the battery consumption when traveling the section and by performing statistical processing. The trained artificial neural network may be obtained through supervised learning in which the altitude of the section and the battery consumption when traveling the section are provided as learning data on the basis of the past driving record. The training of the artificial neural network may be performed in the electronic device 100 itself or may be performed by the external AI server 200. On the basis of common data obtained from a plurality of electric vehicles corresponding to the same type of the electric vehicle, the list of Table 1 or the trained artificial neural network may be included initially in the electric vehicle when the electric vehicle manufacturer releases the electric vehicle. However, the list or the trained artificial neural network may be updated to reflect an actual driving record of the electronic device 100 or the electric vehicle including the electronic device 100. In this case, the list or the trained artificial neural network may be specialized for the corresponding electric vehicle.

In operation 747, the electronic device 100 may predict the battery consumption for the entire travel path by summing the battery consumptions of each section predicted on the basis of the list or the trained artificial neural network in operation 745.

Based on the flowcharts of FIGS. 7 to 9 described above, the electronic device 100 may predict the battery consumption when the electric vehicle travels to its destination. Also, on the basis of this, the electronic device 100 may provide various additional services.

According to various embodiments, an operating method of the electronic device (for example, the electronic device 100 of FIG. 3) may include obtaining a travel path of the electric vehicle derived based on the destination information, and predicting the battery consumption when the electric vehicle travels along the travel path.

According to various embodiments, the predicting the battery consumption when the electric vehicle travels along the travel path may include determining whether there exists a driving record for the travel path, predicting, if there exists a driving record for the travel path, the battery consumption on the basis of the driving record when the vehicle travels along the travel path, and predicting, if there does not exist a driving record for the travel path, the battery consumption when the vehicle travels along the travel path, by dividing the travel path into a plurality of sections and by predicting the battery consumption based on the altitude difference for each section.

According to various embodiments, the predicting, if there does not exist a driving record for the travel path, the battery consumption when the vehicle travels along the travel path, by dividing the travel path into a plurality of sections and by predicting the battery consumption based on the altitude difference for each section may include dividing the travel path into sections of the same predetermined distance, obtaining the altitude difference by obtaining the altitude of the start point and the altitude of the end point of each section, predicting the battery consumption for each section on the basis of the altitude difference, and predicting the battery consumption when the electric vehicle travels along the travel path, by summing the predicted battery consumptions for each of the sections.

According to various embodiments, the predicting the battery consumption for each section on the basis of the altitude difference may include storing, in the memory, a list generated such that the altitude difference and the battery consumption are in correspondence with each other, and predicting the battery consumption for each section by obtaining the battery consumption corresponding to the altitude difference obtained for each section from the list stored in the memory.

According to various embodiments, the list is obtained by obtaining the battery consumption and the altitude difference measured in the section of a predetermined distance and by performing statistical processing when there exists a plurality of battery consumptions obtained for the same altitude difference. The method may further include obtaining the battery consumption and the altitude difference measured in the section of a predetermined distance while operating the electric vehicle, and updating the list by using a result of performing statistical processing when there exists a plurality of battery consumptions obtained for the same altitude difference.

According to various embodiments, the predicting the battery consumption for each section on the basis of the altitude difference may include storing, in the memory, a trained artificial intelligence network model configured to receive the altitude difference as an input and to output the battery consumption, and predicting the battery consumption for each section on the basis of the battery consumption which is output by inputting the altitude difference obtained for each section to the trained artificial intelligence network model.

According to various embodiments, the trained artificial intelligence network model is obtained through supervised learning in which the battery consumption and the altitude difference measured in the section of a predetermined distance while operating the electric vehicle are provided as learning data. The method may further include measuring the battery consumption and the altitude difference in the section of a predetermined distance while operating the electric vehicle equipped with the electronic device, and updating the trained artificial intelligence network model by performing the supervised learning on the trained artificial intelligence network model by using the measured altitude difference and battery consumption as learning data.

According to various embodiments, the predicting the battery consumption when the electric vehicle travels along the travel path may include determining whether there exists only a driving record for a part of the travel path, predicting, if there exists only a driving record for a part of the travel path, the battery consumption on the basis of the driving record, for a part of the travel path having the driving record, predicting the battery consumption for the rest of the travel path, for the rest of the travel path having no driving record, by dividing the rest of the travel path into a plurality of sections and by predicting the battery consumption based on the altitude difference for each of the sections, and predicting the battery consumption when the electric vehicle travels along the travel path by summing the predicted battery consumption for a part of the travel path and the predicted battery consumption for the rest of the travel path.

According to various embodiments, the method may further include determining whether the electric vehicle can reach the destination by comparing the battery consumption predicted when the electric vehicle travels along the travel path with a battery charge state of the electric vehicle, selecting, when, as a result of the determination, the electric vehicle is determined to be unable to reach the destination, on the basis of the battery charge state, a charging station that the vehicle can reach, setting the charging station as a stopover point, and generating a new travel path including the stopover point and informing the user of it.

According to various embodiments, the method may further include obtaining a plurality of travel paths derived based on the destination information, predicting the battery consumption when the electric vehicle travels along each of the plurality of travel paths, and recommending one of the plurality of travel paths to a user on the basis of the predicted battery consumption.

What is claimed is:

1. An electronic device comprising:
an input unit configured to obtain destination information from a user;
a memory; and
at least one processor which is operatively connected to the input unit and the memory,
wherein the at least one processor is configured to:
obtain a travel path of an electric vehicle, which is derived based on the destination information,
determine whether there exists a driving record for the travel path,
when there exists the driving record for the travel path, predict battery consumption based on the driving record for the travel path when the electric vehicle travels along the travel path, and when there does not exist the driving record for the travel path, divide the travel path into a plurality of sections, predict battery consumption based on an altitude difference for each section, and predict the battery consumption by summing up the predicted battery consumption for each section when the electric vehicle travels along the travel path.

2. The electronic device of claim 1, wherein, the at least one processor is further configured to:
when there does not exist the driving record for the travel path, divide the travel path into the plurality of sections of a same predetermined distance, obtain the altitude difference by obtaining an altitude of a start point and an altitude of an end point of each section, predict the battery consumption for each section based on the altitude difference, and predict the battery consumption when the electric vehicle travels along the travel path, by summing the predicted battery consumption for each section.

3. The electronic device of claim 2, wherein the at least one processor is further configured to:
store, in the memory, a list generated such that the altitude difference and the battery consumption are in correspondence with each other and predict the battery consumption for each section by obtaining, from the list stored in the memory, the battery consumption corresponding to the altitude difference obtained for each section.

4. The electronic device of claim 3,
wherein the list is obtained by obtaining the battery consumption and the altitude difference measured in each of the plurality of sections of the predetermined distance and by performing statistical processing when there exist a plurality of battery consumptions obtained for a same altitude difference, and
wherein the at least one processor is further configured to obtain the battery consumption and the altitude difference measured in each of the plurality of sections of the predetermined distance while operating the electric vehicle and update the list by using a result of performing the statistical processing when there exist the plurality of battery consumptions obtained for the same altitude difference.

5. The electronic device of claim 2,
wherein the memory comprises a trained artificial intelligence network model configured to receive the altitude difference as an input and to output the battery consumption, and
wherein the at least one processor is further configured to predict the battery consumption for each section based on battery consumption which is output by inputting the altitude difference obtained for each section to the trained artificial intelligence network model.

6. The electronic device of claim 5,
wherein the trained artificial intelligence network model is obtained through supervised learning in which the battery consumption and the altitude difference measured in each of the plurality of sections of the predetermined distance while operating the electric vehicle are provided as learning data, and
wherein the at least one processor is further configured to measure the battery consumption and the altitude difference in each of the plurality of sections of the predetermined distance while operating the electric vehicle equipped with the electronic device and update the trained artificial intelligence network model by performing the supervised learning on the trained artificial intelligence network model by using the measured altitude difference and the measured battery consumption as the learning data.

7. The electronic device of claim 1, wherein the at least one processor is further configured to:
determine whether there exists only a driving record for a part of the travel path,
when there exists only the driving record for the part of the travel path, predict battery consumption based on the driving record for the part of the travel path when the electric vehicle travels along the part of the travel path, for the part of the travel path having the driving record for the part of the travel path,
for a rest of the travel path having no driving record for the rest of the travel path, divide the rest of the travel path into a plurality of sections, predict battery consumption for each section of the rest of the travel path based on an altitude difference for each section of the rest of the travel path, and then predict battery consumption for the rest of the travel path, and
predict the battery consumption when the electric vehicle travels along the travel path by summing up the predicted battery consumption for the part of the travel path and the predicted battery consumption for the rest of the travel path.

8. The electronic device of claim 1, further comprising a sensing unit configured to sense a battery charge state of the electric vehicle,
wherein the at least one processor is further configured to:
determine whether the electric vehicle is able to reach a destination by comparing the battery consumption predicted when the electric vehicle travels along the travel path with the battery charge state of the electric vehicle, and
when, as a result of the determination, the electric vehicle is determined to be unable to reach the destination, select, based on the battery charge state, a charging station that the vehicle is able to reach, set the charging station as a stopover point, generate a new travel path including the stopover point, and inform the user of the new travel path.

9. The electronic device of claim 1, wherein the at least one processor is further configured to:
obtain a plurality of travel paths derived based on the destination information,
predict battery consumption when the electric vehicle travels along each of the plurality of travel paths, and
recommend one of the plurality of travel paths to the user based on the predicted battery consumption when the electric vehicle travels along each of the plurality of travel paths.

10. An operating method of an electronic device, the method comprising:
obtaining a travel path of an electric vehicle, which is derived based on destination information; and
predicting battery consumption when the electric vehicle travels along the travel path,
wherein the predicting the battery consumption when the electric vehicle travels along the travel path comprises:
determining whether there exists a driving record for the travel path;
predicting, when there exists the driving record for the travel path, the battery consumption based on the driving record for the travel path when the vehicle travels along the travel path; and
predicting, when there does not exist the driving record for the travel path, the battery consumption when the vehicle travels along the travel path, by dividing the travel path into a plurality of sections and by predicting battery consumption based on an altitude difference for each section.

11. The operating method of claim 10, wherein the predicting, when there does not exist the driving record for the travel path, the battery consumption when the vehicle travels along the travel path, by dividing the travel path into the plurality of sections and by predicting the battery consumption based on the altitude difference for each section comprises:
dividing the travel path into the plurality of sections of the same predetermined distance;
obtaining the altitude difference by obtaining an altitude of a start point and an altitude of an end point of each section;
predicting the battery consumption for each section based on the altitude difference; and
predicting the battery consumption when the electric vehicle travels along the travel path, by summing the predicted battery consumption for each section.

12. The operating method of claim 11, wherein the predicting the battery consumption for each section based on the altitude difference comprises:
storing, in a memory, a list generated such that the altitude difference and the battery consumption are in correspondence with each other; and
predicting the battery consumption for each section by obtaining the battery consumption corresponding to the altitude difference obtained for each section from the list stored in the memory.

13. The operating method of claim 12,
wherein the list is obtained by obtaining the battery consumption and the altitude difference measured in each of the plurality of sections of the predetermined distance and by performing statistical processing when there exist a plurality of battery consumptions obtained for a same altitude difference, and
wherein the method further comprises:
obtaining the battery consumption and the altitude difference measured in each of the plurality of sections of the predetermined distance while operating the electric vehicle; and
updating the list by using a result of performing the statistical processing when there exist the plurality of battery consumptions obtained for the same altitude difference.

14. The operating method of claim 11, wherein the predicting the battery consumption for each section based on the altitude difference comprises:
storing, in a memory, a trained artificial intelligence network model configured to receive the altitude difference as an input and to output the battery consumption; and
predicting the battery consumption for each section based on battery consumption which is output by inputting the altitude difference obtained for each section to the trained artificial intelligence network model.

15. The operating method of claim 14,
wherein the trained artificial intelligence network model is obtained through supervised learning in which the battery consumption and the altitude difference measured in each of the plurality of sections of the predetermined distance while operating the electric vehicle are provided as learning data, and
wherein the method further comprises:
measuring the battery consumption and the altitude difference in each of the plurality of sections of the predetermined distance while operating the electric vehicle equipped with the electronic device; and
updating the trained artificial intelligence network model by performing the supervised learning on the trained artificial intelligence network model by using the measured altitude difference and the measured battery consumption as the learning data.

16. The operating method of claim 10, wherein the predicting the battery consumption when the electric vehicle travels along the travel path further comprises:
determining whether there exists only a driving record for a part of the travel path;
predicting, when there exists only the driving record for the part of the travel path, battery consumption based on the driving record for the part of the travel path when the electric vehicle travels along the part of the travel path, for the part of the travel path having the driving record for the part of the travel path;
predicting battery consumption for a rest of the travel path, for the rest of the travel path having no driving record for the rest of the travel path, by dividing the rest of the travel path into a plurality of sections and by predicting battery consumption for each section of the rest of the travel path based on an altitude difference for each section of the rest of the travel path; and
predicting the battery consumption when the electric vehicle travels along the travel path by summing the predicted battery consumption for the part of the travel path and the predicted battery consumption for the rest of the travel path.

17. The operating method of claim 10, further comprising:
determining whether the electric vehicle is able to reach a destination by comparing the battery consumption predicted when the electric vehicle travels along the travel path with a battery charge state of the electric vehicle;
selecting, when, as a result of the determination, the electric vehicle is determined to be unable to reach the destination, based on the battery charge state, a charging station that the vehicle is able to reach;
setting the charging station as a stopover point; and
generating a new travel path including the stopover point and informing a user of the new travel path.

18. The operating method of claim 10, further comprising:
obtaining a plurality of travel paths derived based on the destination information;
predicting battery consumption when the electric vehicle travels along each of the plurality of travel paths; and
recommending one of the plurality of travel paths to a user based on the predicted battery consumption when the electric vehicle travels along each of the plurality of travel paths.

* * * * *